United States Patent
Livesay et al.

(10) Patent No.: US 7,753,562 B2
(45) Date of Patent: Jul. 13, 2010

(54) INTEGRATED MULTI-COLORED LED LIGHT SOURCE WITH HEATSINK AND COLLIMATOR

(75) Inventors: William R. Livesay, San Diego, CA (US); Scott M. Zimmerman, Basking Ridge, NJ (US); Richard L. Ross, Del Mar, CA (US)

(73) Assignee: Goldeneye, Inc., San Diego, CA (US)

( * ) Notice: Subject to any disclaimer, the term of this patent is extended or adjusted under 35 U.S.C. 154(b) by 233 days.

(21) Appl. No.: 12/154,397

(22) Filed: May 21, 2008

(65) Prior Publication Data

US 2009/0085047 A1 Apr. 2, 2009

Related U.S. Application Data

(60) Provisional application No. 60/931,256, filed on May 22, 2007.

(51) Int. Cl.
*F21V 7/20* (2006.01)

(52) U.S. Cl. ...................................... 362/310; 362/580

(58) Field of Classification Search ................. 362/310, 362/580
See application file for complete search history.

(56) References Cited

U.S. PATENT DOCUMENTS

| | | | |
|---|---|---|---|
| 3,681,592 A * | 8/1972 | Hugelshofer ................ 362/580 |
| 6,869,206 B2 | 3/2005 | Zimmerman et al. |
| 6,960,872 B2 | 11/2005 | Beeson et al. |
| 7,025,464 B2 | 4/2006 | Beeson et al. |
| 7,040,774 B2 | 5/2006 | Beeson et al. |
| 7,048,385 B2 | 5/2006 | Beeson et al. |
| 7,510,313 B2 * | 3/2009 | Blum et al. ................. 362/580 |
| 2006/0203510 A1 * | 9/2006 | Noh et al. ................... 362/580 |

* cited by examiner

*Primary Examiner*—David V Bruce
(74) *Attorney, Agent, or Firm*—William Propp, Esq.

(57) ABSTRACT

A LED light source is integrated with a heatsink and a collimator. Four isolated heatsinks form an optical taper in which a single color LED is mounted. The LEDs are arranged to form a reflective light recycling cavity. Up to four different colors can be combined inside the light recycling cavity to form a uniform and homogenous mixing of the colors at the exit aperture of the light recycling cavity and/or the exit aperture of the collimator/heatsink.

17 Claims, 8 Drawing Sheets

INTEGRATED MULTI-COLORED LED LIGHT SOURCE WITH HEATSINK AND COLLIMATOR

REFERENCE TO PRIOR APPLICATION

This application claims the benefit of U.S. Provisional Patent Application Ser. No. 60/931,256, filed on May 22, 2007, which is herein incorporated by reference.

BACKGROUND OF THE INVENTION

In U.S. Pat. Nos. 6,869,206, 6,960,872, 7,025,464, 7,040,774, and 7,048,385, a means of generating a high brightness light source uses light emitting diodes in a light recycling cavity. This present invention relates to an improved method and process for fabricating an integrated light recycling cavity, color combiner, optical collimator, and heatsink. In U.S. Pat. No. 7,040,774, a light recycling cavity contains different colored LEDs within the cavity. That light recycling cavity permits multiple LEDs of different colors to mix their outputs within the cavity. This multiple and mixed outputs can be very efficient in that the étendue of the light source is defined by the exit aperture of the light recycling cavity and not by the cumulative area of the LEDs within the cavity.

In conventional light engines used for projection displays, a white light source, such as an arc lamp, must be broken up into multiple colors to generate a full color display. This white light source is very inefficient. For example, a color separation system using a color wheel of alternating red, green, and blue filters can maximally only be 33% efficient. For a light engine using separate distinct colored sources, the sources must be combined onto the same optical path using dichroic mirrors, which can also be inefficient.

Light sources for microscopes, endoscopes, fiber optic illuminators, spotlights, and down lighting for general illumination all have a need for a tunable color temperature (e.g. being able to select the mix of red, green and blue or other color) projected. Space and volume is at a premium for optical systems that are very compact, such as pocket projectors. With conventional light sources, a relatively long optical train is required to collimate and integrate the colors into the projection engine.

Adding to the overall size are the heatsinks required to dissipate the heat from the light source. These heatsinks add volume, which must be accommodated within a compact optical system.

LEDs typically emit in a Lambertian full solid angle. To efficiently couple this light into an optical system requires collecting this wide angle light and collimating it. This collection and collimation is typically done with an optical tunnel or taper. The optical tunnel consists of four mirrored surfaces, which form a tunnel. Alternatively, a solid glass tapered rod may be used. The output aperture of the tunnel is larger than the input of the tunnel to collimate the light. The length of the tunnel must necessarily be made long to provide homogenization of the light that enters the tunnel. 40 mm to 80 mm is typical for the length of these tunnels. Thus, the tunnel not only collimates the light, it also aids in making the light more uniform.

In the prior art, these optical tunnels are appended to the output of LEDs where the LEDs are mounted on their own heatsink, the heatsink protruding in the opposite direction of the tunnel. The combination of the heatsink and the optical tunnel add considerably to the overall size of the finished light source.

Minimizing the manufacturing cost is paramount in consumer products, such as projectors, televisions, etc. Optical tunnels and heatsinks can add substantially to the cost of the finished product.

There is a need for a light source for these various applications that is compact, inexpensive, and well collimated and can be tuned to different color temperatures or different colors depending on the application, mood, or environment.

SUMMARY OF THE INVENTION

An integrated heatsink collimator forms a light emitting diode recycling light cavity. In one embodiment, four metal tapered heatsinks with mirrored interior faces form an optical taper light tunnel. One or more LEDs is mounted to each heatsink such that the LEDs are on opposite sides of a light recycling cavity. The bottom of the cavity can have an additional LED or a highly reflective specular or highly reflective diffused surface or a highly reflective pyramidal surface.

Also, each heatsink can be electrically isolated from the other heatsinks, which form the structural elements of the recycling light cavity. Each heatsink has multiple heat dissipating fins.

Light generated within the light recycling cavity exits the open end of the light recycling cavity and is guided and reflected along the highly polished and/or silver mirrored faces of the heatsink. The heatsinks are fitted together at a slight angle from one end to the other to form an optical tapered tunnel. Light emitted in a Lambertian (hemispherical) distribution will be collimated by the time it exits the end of the heatsink taper.

Another embodiment of the invention is the unique LED submount and interconnect system which allows for precise alignment of the LEDs to the optical taper and a very efficient thermal coupling of the LED to the heatsink. Other aspects of the invention will become apparent from the following more detailed description, taken in conjunction with the accompanying drawings.

DETAILED DESCRIPTION OF THE PREFERRED EMBODIMENTS

The invention uniquely combines a finned heatsink and an optical tunnel (and/or taper) into a one piece integrated assembly. A further embodiment of the invention is coupling a light recycling cavity as described in U.S. Pat. Nos. 6,869,206 and 7,040,774 to provide a compact collimated multi-colored LED light source. A further embodiment of the invention is a novel LED mount and interconnect that provides both easy electrical connection and efficient heat spreading of the heat generated by the LED. The invention can be better understood by referring to the following drawings.

Figure 1A:
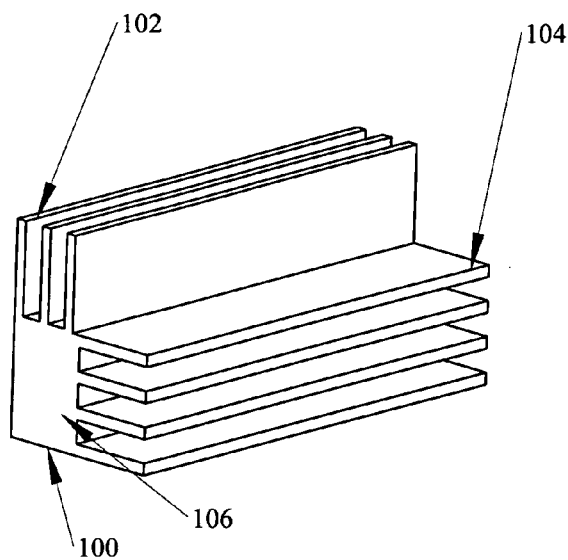
FIG. 1A is a perspective view of a finned heatsink with mirrored surface of the present invention.

Shown in FIG. 1A is a perspective view of a finned heatsink 100. This heatsink can be made out of aluminum, copper, silver, etc. The heatsink, if made from aluminum, is easily fabricated at low cost by extrusion where the aluminum fins 102, 104 are formed by the extrusion process. Once extruded, the aluminum heatsinks are cut into smaller lengths appropriate to the optical tunnel to be fabricated. If a tapered optical tunnel is desired, the blocks are cut at an angle to match the taper angle. The blocks are then highly polished on one side 106 and/or coated with a dielectric mirror or protected silver mirror on that side 106. Optionally, a thin glass mirror can be attached with an adhesive to form the mirrored surface on the side 106.

Figure 1B:
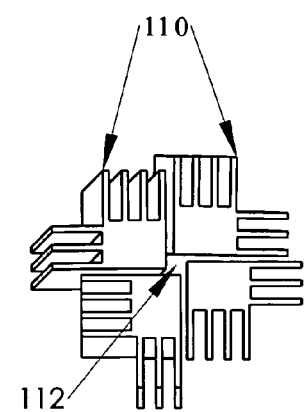
FIG. 1B is a plan view of four heatsinks with mirrored surfaces assembled to form an optical tunnel of the present invention.

To form an optical taper in FIG. 1B, the heatsinks 110 are assembled with their mirrored surfaces 112 facing to the inside of the channel created by the four heatsink block assembly.

Figure 1C:
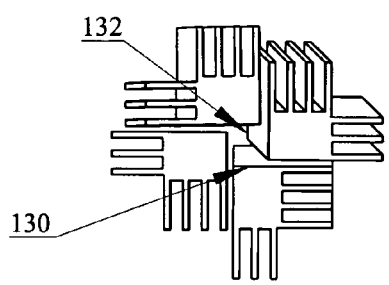
FIG. 1C is a plan view of the output side of the optical tunnel formed by the four mirrored heatsinks of the present invention.

To form a collimating optical tunnel, the output area 130 in FIG. 1C of the mirrored channel tunnel is larger than the input area 132 of the channel. Étendue is preserved through this optical tunnel. Given a Lambertian light distribution on the input, the half angle of the output light bundle is equal to the arc sine of the square root of the ratio of the input area to the output area. Due to the novel arrangement of the mirrored optical block heatsinks, almost any output angle can be achieved by merely sliding the mirrored surfaces to open up a larger opening at the output end of the optical tunnel.

For example, if it is desired to collimate light emitted by an LED or LED light recycling cavity to an included angle of 15° (half angle), the ratio of input area to output area must be approximately 20:1. A ±15° half angle corresponds to an f/2 optical system. Therefore, to efficiently couple an LED, LED array, or LED light recycling cavity with an output area of 1 mm$^2$ to a f/2 lens system, the output area of the optical tunnel needs to be approximately 20 mm.

Most micro-valve display devices, such as digital mirror device, liquid crystal on silicon, etc., are not square, as they match the ratio of the display (4:3, 16:9, etc.). The optical tunnel formed by the mirrored heatsinks can easily be adjusted match any aspect ratio. For example, for a 4:3 display in the example just cited, an output aperture of dimensions 3.9 mm×5.2 mm would be selected. The output aperture 130 of the optical tunnel in FIG. 1C is formed by the four mirrored heatsinks 134. Superimposed on this view is the input aperture 132 at the other end of the optical tunnel.

Figure 1D:
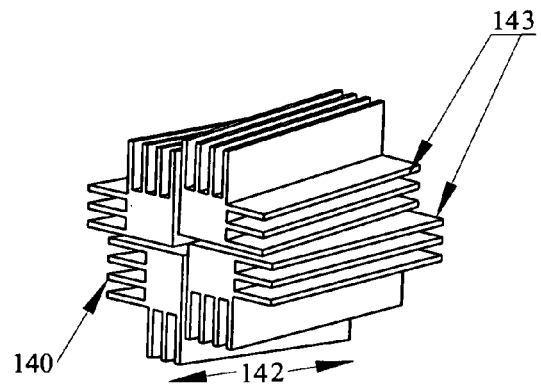
FIG. 1D is a perspective view of the integrated heatsink optical tapered tunnel of the present invention.

FIG. 1D is a perspective view of the integrated heatsink optical tapered tunnel 140. The offset 143 of the heatsink blocks diverge outward to form the larger opening for the output of the optical taper. The length 142 of the optical tunnel is used to homogenize the light input into the tunnel. If there are four multi-colored LEDs placed at the input of the optical tunnel, the light will be mixed at the output side of the optical tunnel.

For example, if red, green, blue, and yellow LEDs are placed with their emitting faces at the input side of the tunnel, a uniform white light will be produced at the output end of the tunnel if there is sufficient length in the tunnel for mixing. Further, the color temperature of the light emitted at the output may be adjusted by adjusting the drive currents to the LEDs. U.S. Pat. Nos. 6,869,206 and 7,040,774 have shown that a higher brightness LED light source may be achieved by forming an LED light recycling cavity.

Another embodiment of this invention is a novel method to form such a cavity integrated to the optical tunnel/heatsinks. Each RGB LED is mounted to an edge of a thin metal plate to fabricate a multi-colored light recycling cavity. The metal plate may be silver, copper, gold, etc. This plate, which may be 10 mm by 10 mm, is the same thickness as the LED.

Figure 2A:
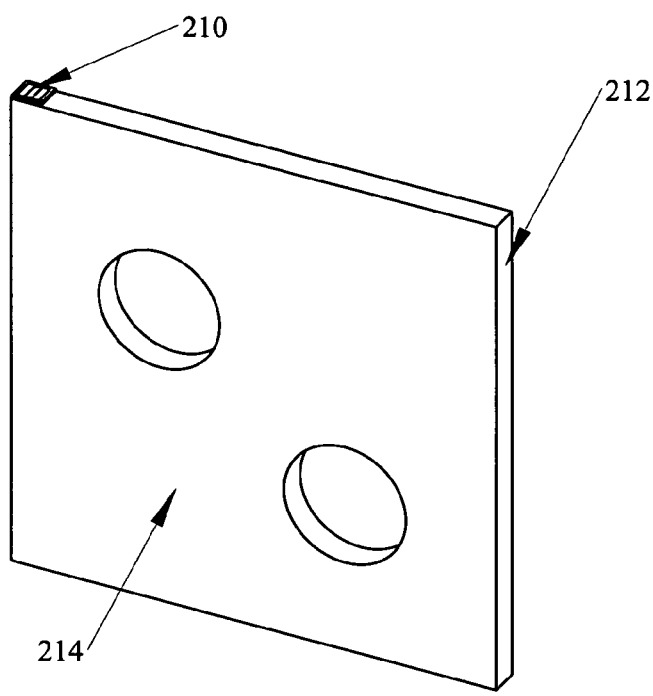
FIG. 2A is perspective view of an LED mounted to an edge of a thin metal plate of the present invention.

The LED 210 in FIG. 2A has been eutectically soldered to a metal plate 214. The metal plate may be silver, copper, gold, etc. If the LED 210 is 1 mm×1 mm, the thickness of the metal plate 212 is also preferably 1 mm. This plate 212 acts as both an electrical interconnect to the bottom of the LED and a heat spreader for the LED 210.

Figure 2B:
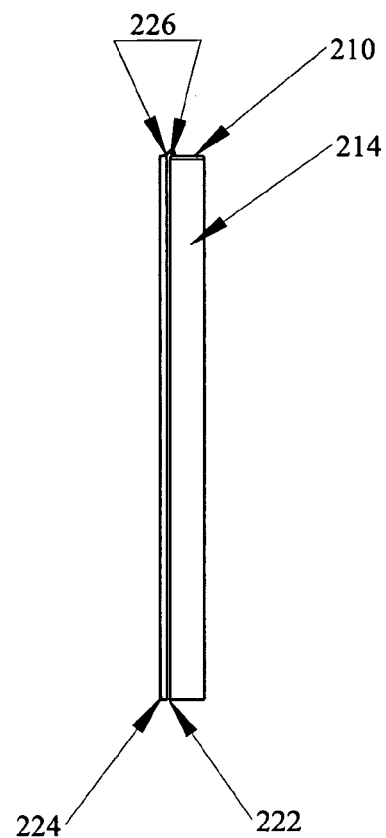
FIG. 2B is a cross-sectional view of LED submount metal sandwich of the present invention.

A metal sandwich 220 in FIG. 2B is fabricated to complete the electrical connection to the LED 210. This sandwich 220 consists of the thin metal plate 214 with LED 210 attached, a thin insulating film or adhesive 222, and another thin metal plate 224 as shown. The thin insulating film or adhesive 22 is between the first thin metal plate 214 and the second thing metal plate 224. This sandwich 220 can be assembled by a lamination process and/or with high temperature adhesives. The thin outside metal 224, is offset 226 so that its end face 228 is at the same level as the top of the LED 210.

Figure 2C:
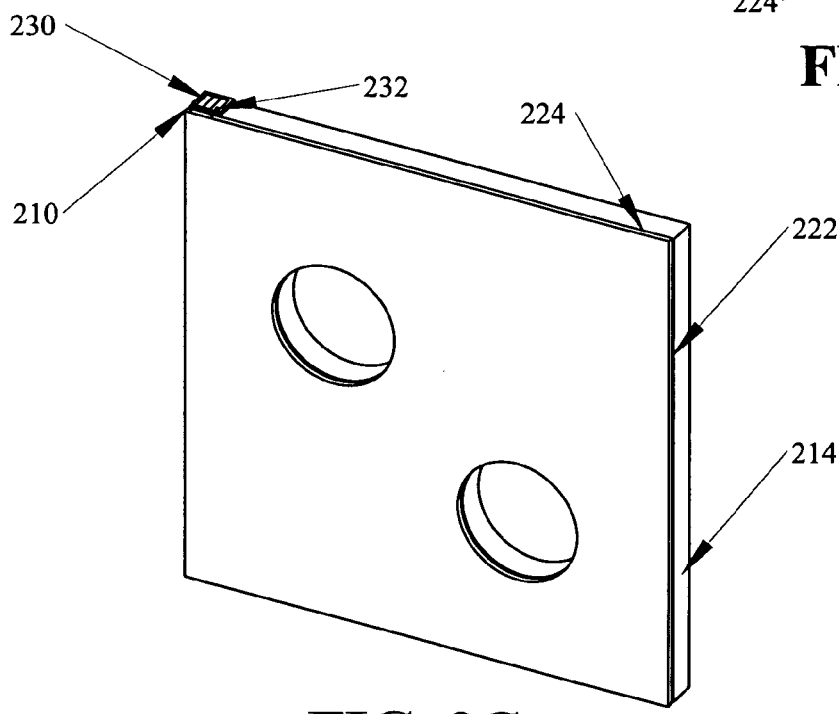
FIG. 2C is a perspective view of LED submount sandwich with LED mounted and wirebonds of the present invention.

As shown in FIG. 2C, connection to the top contact 230 of the LED 210 is made via wirebonds 232 or ribbon wirebonds from the LED 210 across the thin insulating film 222 to the outside metal plate 224. Preferable thickness of the thin insulating adhesive 222 is 15 μm to 25 μm. Preferable thickness of the outside thin metal plate 224 is 100 μm to 200 μm.

Figure 3A:
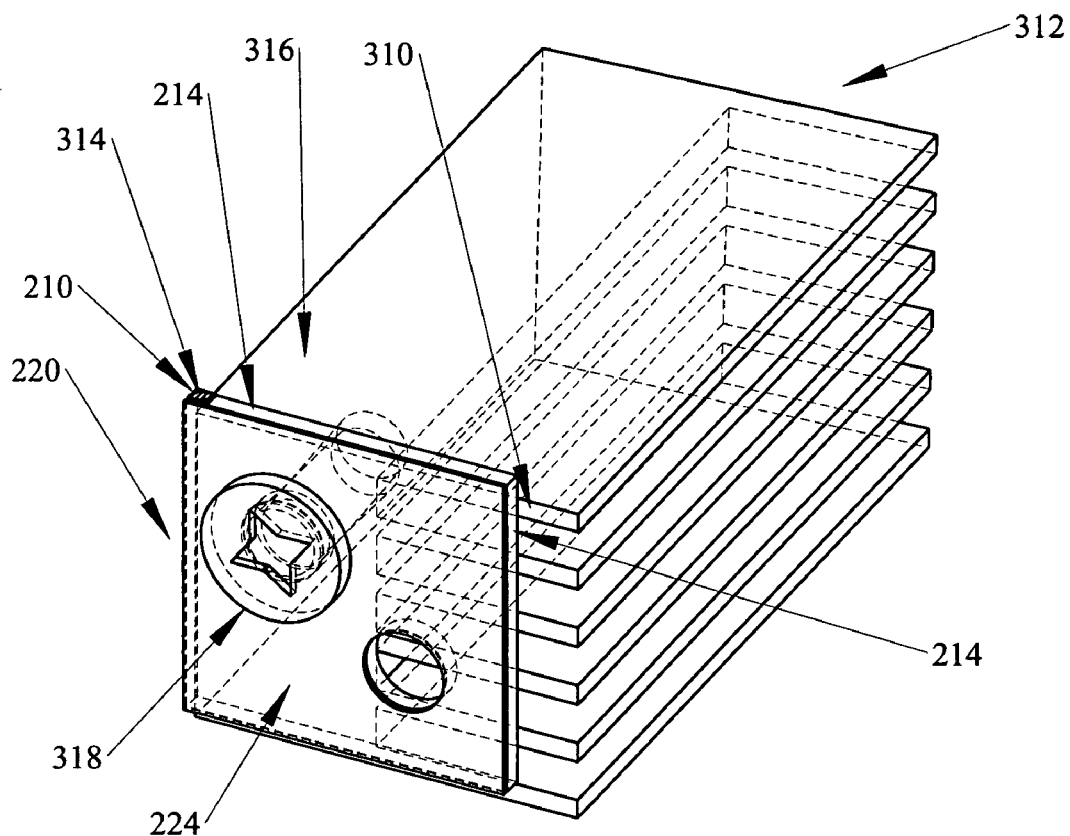
FIG. 3A is a perspective view of the LED sandwich assembly fastened to input face of mirrored heatsink of the present invention.

As shown in FIG. 3A, the LED 210 is mounted on the metal plate 214 and the sandwich 220 is fastened to the end face 310 of the heatsink 312 optical taper block such that the LED 210 emitting surface 314 lines up with the mirrored surface 316 of the heatsink block 312. The LED 210 is fastened to the metal plate 214. The metal plate 214 is intimately pressed against the end face 310 of the mirrored heatsink with the screw 318. Thermal conductivity can be further enhanced between the LED submount metal plate 214 and heatsink 312 by using thermal grease or high conductivity thermal epoxy.

Figure 3B:
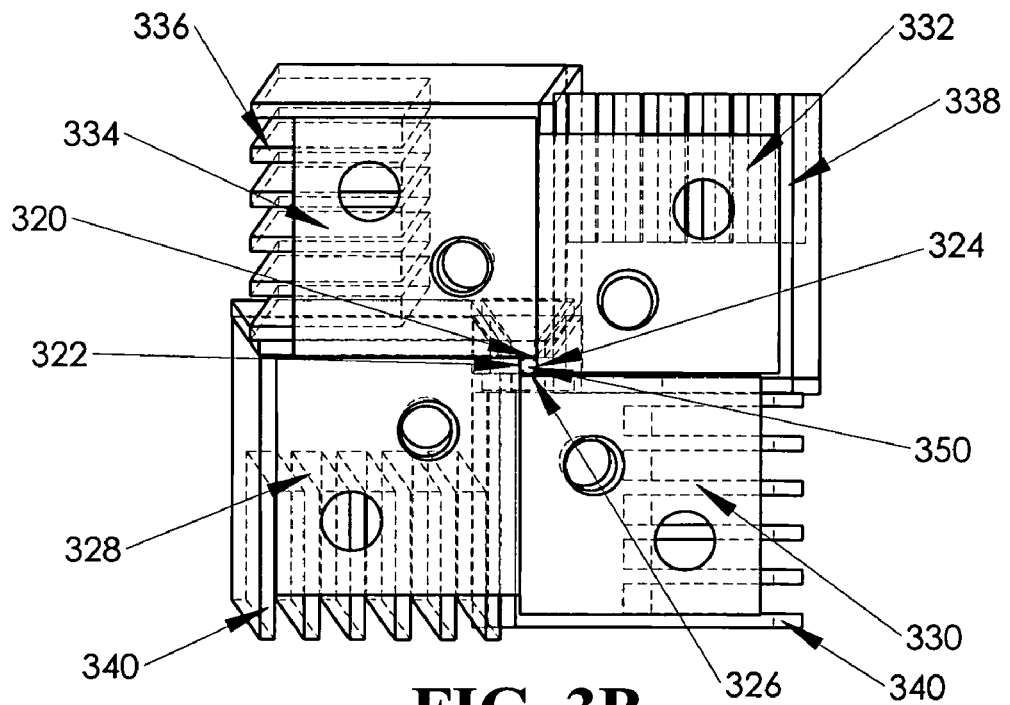
FIG. 3B is a plan view showing four LED sandwiches mounted to the input end face of the integrated heatsink tunnel of the present invention.
Figure 4A:
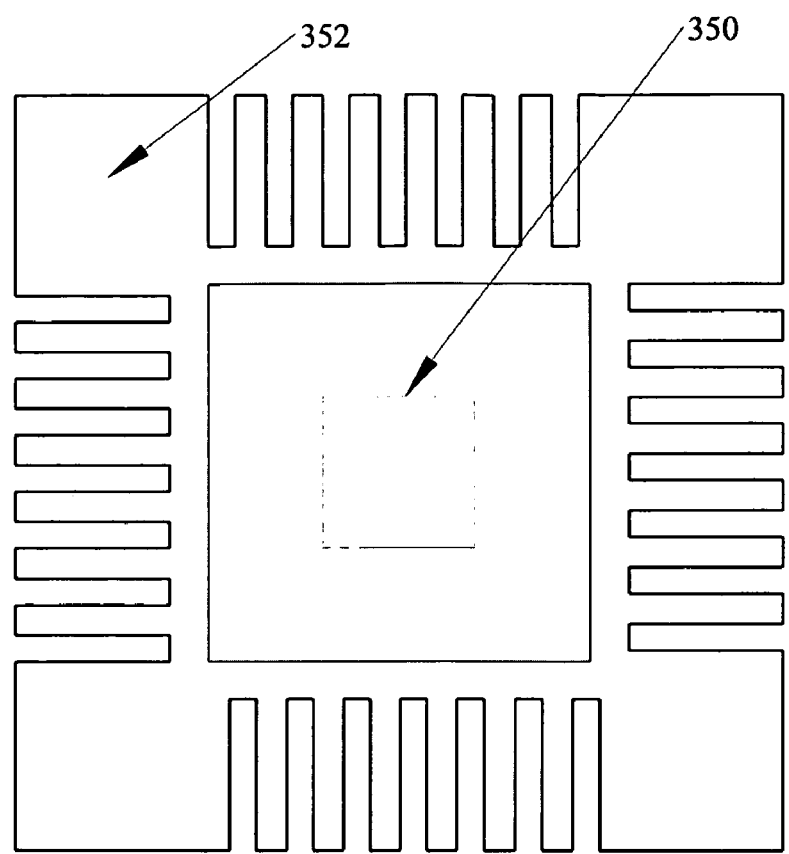
FIG. 4A is a plan view of reflective base plate mounted on bottom side of light recycling cavity of the present invention.

Four LEDs 320, 322, 324, and 326 in FIG. 3B are mounted on their sandwiches 328, 330, 332, 334, which are in turn mounted to the input end faces 336, 338, 340, and 342 of the mirrored optical tunnel heatsink. A reflective base plate 352 is placed over the opening 350, as shown in FIG. 4A, to complete the light recycling cavity.

Figure 4B:
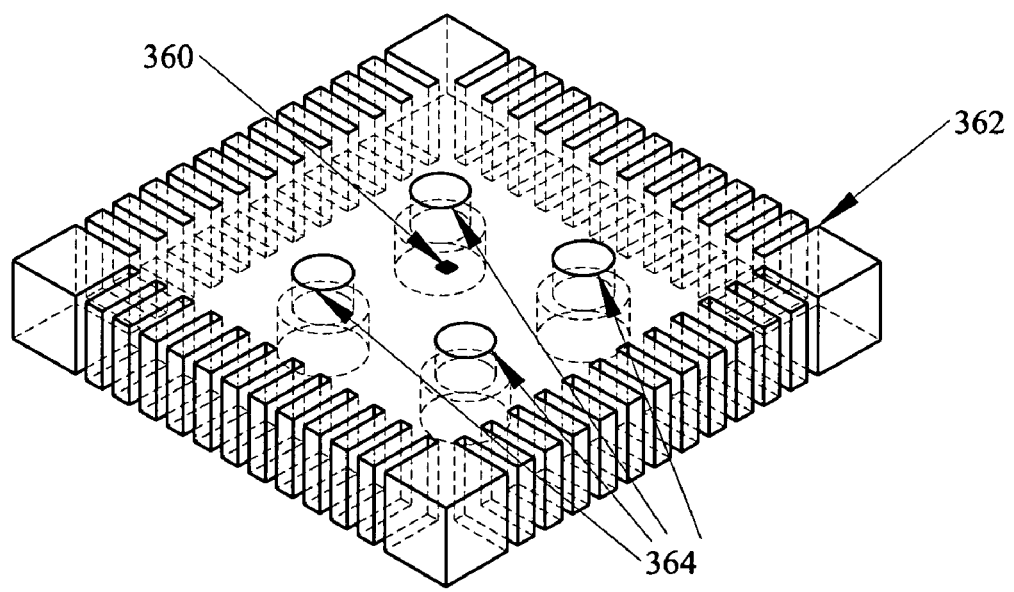
FIG. 4B is a perspective view of a bottom base plate with LED of the present invention.

Optionally, a fifth LED 360 can be placed over the opening 350 (as seen in FIG. 3B) on the bottom of the light recycling cavity. As shown in FIG. 4B, this LED 360 can be mounted to its own separate base plate heatsink 362. The base plate has through holes 364 for screwing it to the sandwich base plate.

Figure 4C:
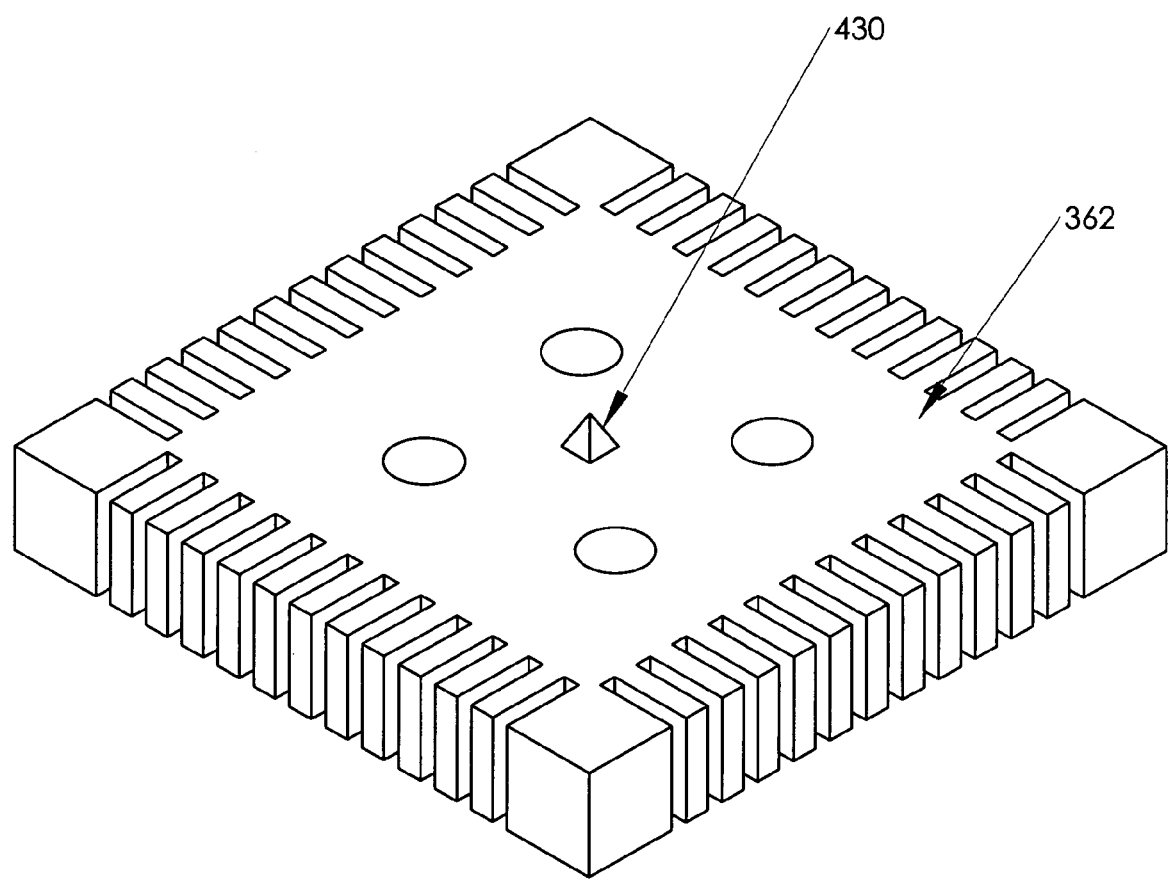
FIG. 4C is a perspective view of the bottom base plate with reflecting pyramid of the present invention.

Another embodiment of the invention is to insert, in place of a reflective surface or LED, a highly polished mirrored pyramid 430 on the center of the base plate 362, as shown in FIG. 4C. The pyramid 430 will protrude up through the bottom of the light recycling cavity. The pyramid's base will be the same dimensions as the input of the optical tunnel. The pyramid height can be from one third to one and a half times the height of the LED light recycling cavity.

Figure 4D:
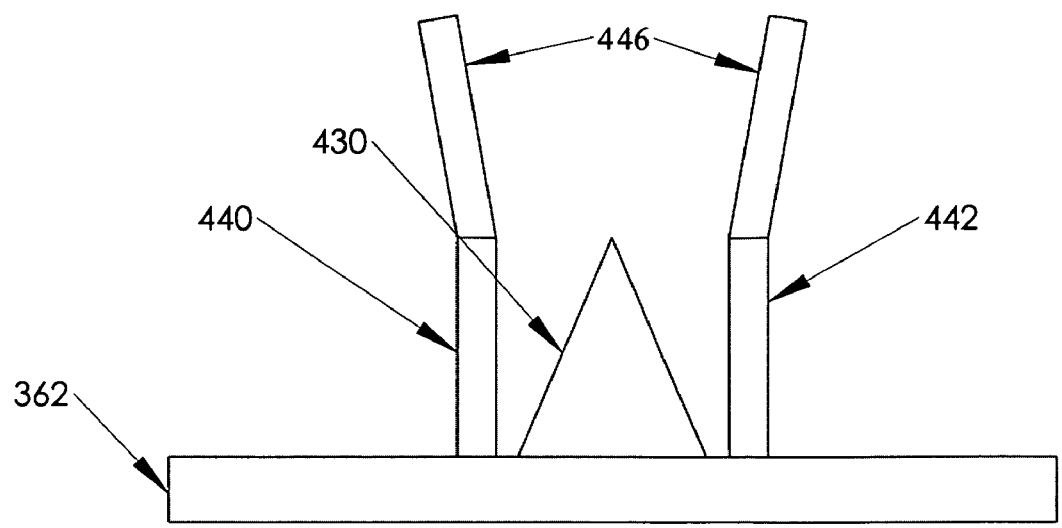
FIG. 4D is a cross-sectional view of the bottom base plate with reflecting pyramid inserted in the light recycling cavity of the present invention.

A cross-sectional view of the pyramid 430 mounted on the base plate 362 and inserted into the light recycling cavity is shown in FIG. 4D. The pyramid enhances the light efficiency of the light recycling cavity by reflecting the light emitted by the side mounted LEDs 440, 442 and directing it out the output aperture of the light recycling cavity and into the input aperture 444 of the optical tunnel 446.

Figure 4E:
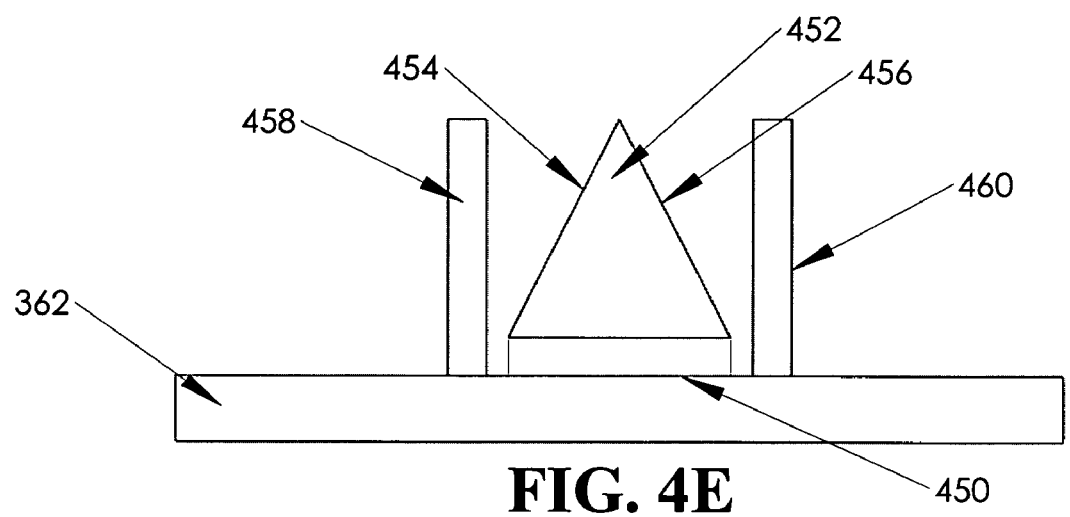
FIG. 4E is a cross-sectional view of a dichroic pyramid mounted on a bottom LED inserted in the light recycling cavity of the present invention.

Another embodiment of this invention is to mount a pyramid with dichroic faces on top of the bottom or fifth LED in FIG. 4E. For a multi-colored light recycling cavity using, for example red, green and blue, this can greatly enhance the efficiency of the cavity. Typically, red LEDs do not have high reflectivity to blue and green wavelength light. As shown in U.S. Pat. Nos. 6,869,206 and 7,040,774, the reflectivity of the LEDs determine the efficiency of the light recycling cavity. By placing the red LED 450 on the base plate 362 and placing a dichroic pyramid on top of the LED, the light emitted by the red LED 450 will pass through the two dichroic faces 454, 456 of the pyramid and up and out of the cavity. The dichroic coating on the faces 454, 456 are, however, highly reflective to blue and green wavelengths. Therefore, light emitted by the blue LED 458 and the green LED 460 is reflected off of the slope faces of the pyramid and out the light recycling cavity. Alternately, a flat dichroic plate can be used instead of a pyramid.

Figure 4F:
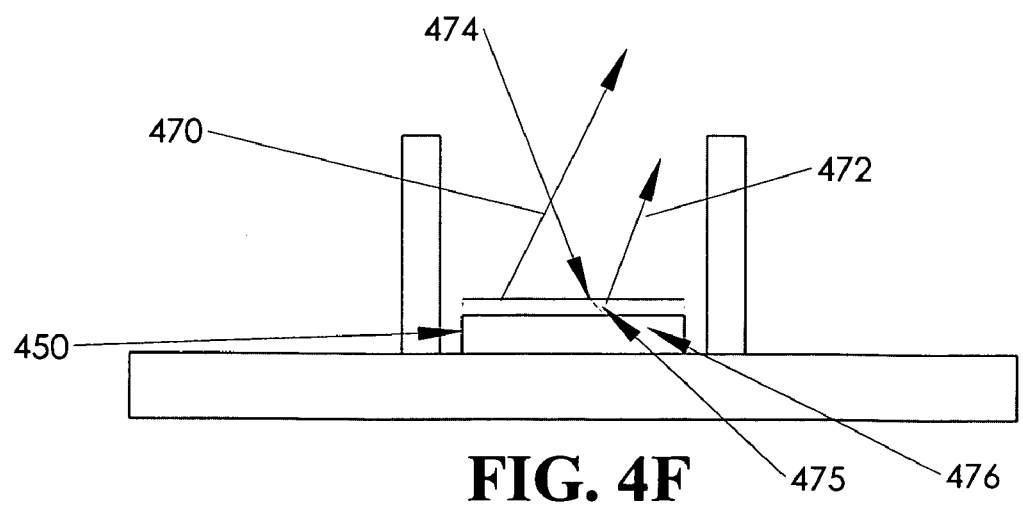
FIG. 4F is a cross-sectional view of a flat dichroic plate mounted on a bottom mounted LED inside a light recycling cavity of the present invention.

Similarly, a flat dichroic on top of the red LED can perform a similar function to the pyramid as light emitted by the red LED will typically be collimated by the flat dichroic plate. The collimation is due to the light emitted at a large enough angle from the normal will be larger than the critical angle required for it to escape from the dielectric plate. The light ray 470 in FIG. 4F is emitted by the red LED 450 and passes through the dichroic 475 and out the light recycling cavity. Light ray 472, however, emitted from LED 450 is greater than the critical angle required for it to escape and is reflected at point 474 back onto the LED 476. The LED, being a partially diffused surface, can scatter light ray 472 in another direction, in this case making it more normal so that it can escape 474 the dichroic 475 and out the end of the cavity.

Figure 5:
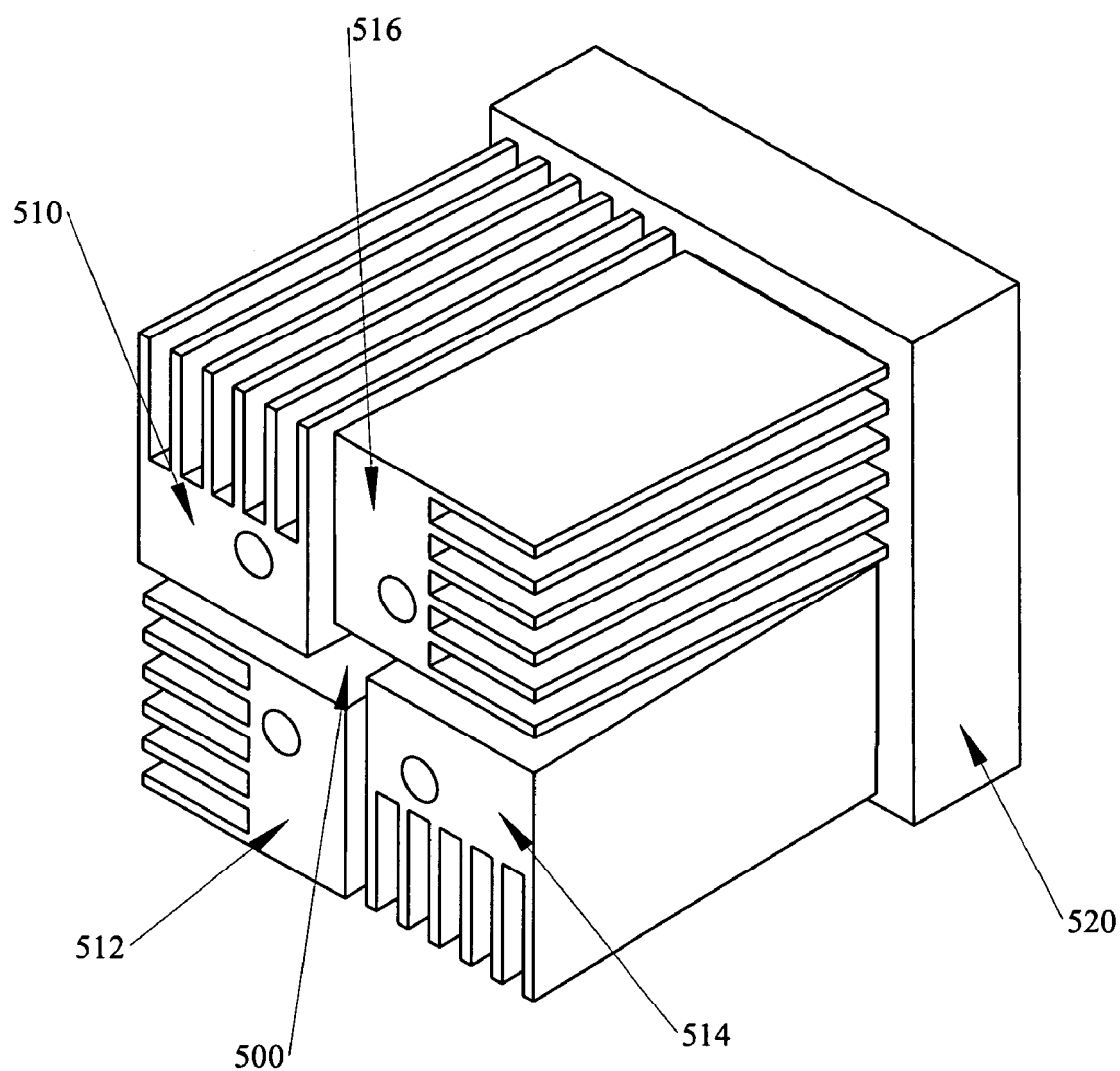
FIG. 5 is a perspective view of the completed integrated optical tunnel, heatsink and light recycling cavity of the present invention.

The completed integrated optical taper 510 heatsinks 510, 512, 514, 516 and light recycling cavity with base plate 520 is shown in FIG. 5.

This invention discloses a novel and unique way to form an integrated optical taper, integrated heatsink and light recycling cavity. Alternative ways of practicing this invention can be readily done by those skilled in the art. For example, a glass optical tunnel can be inserted in the channel formed by the four heatsinks. This optical tunnel can be hollow with mirrored inside surfaces or can be solid glass.

Figure 6:
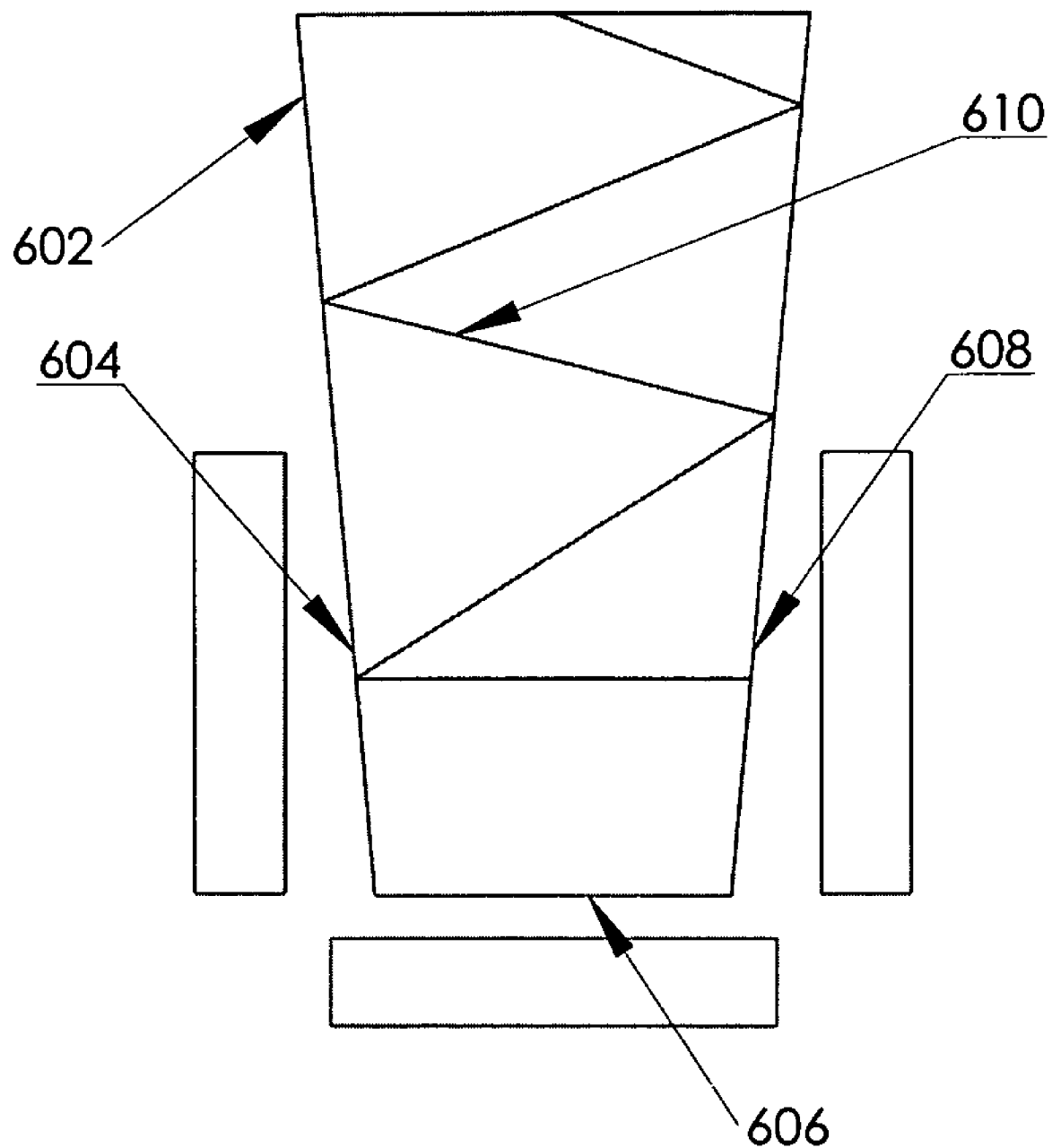
FIG. 6 is a cross-sectional view of a solid optical taper inserted in the channel formed by the heatsinks and protruding down into the light recycling cavity of the present invention.

Another embodiment of the invention can incorporate a solid glass taper that actually protrudes down inside the light recycling cavity as shown in FIG. 6. This glass taper 602 could have dichroic coatings on surfaces 604, 606, 608. These dichroic coatings can be tuned to allow the light from each of the different colored LEDs to pass through them and into the solid glass taper where the three wavelengths would mix, reflecting 610 off the inside surfaces of the optical taper 602, and out the end of the optical taper.

A multitude of combinations of practicing this invention can be achieved by one skilled in the art.

While the invention has been described in conjunction with specific embodiments and examples, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A light recycling cavity comprising
   four heatsinks arranged to form a channel, each of said four heatsinks having a highly reflective surface, each of said highly reflective surfaces forming the interior of said channel;
   said channel having an input area and an output area;
   at least one light emitting diode mounted on said highly reflective surface of each of said four heatsinks for emitting light through said output area of said channel; and
   wherein said output area of said channel is larger than said input area of said channel.

2. The light recycling cavity of claim 1 wherein said channel is tapered.

3. The light recycling cavity of claim 1 wherein said highly reflective surface is highly polished, coated with a dielectric mirror, coated with a silver mirror or has a mirror attached to said surface.

4. The light recycling cavity of claim 1 wherein said at least one light emitting diode is mounted on a first metal plate, a second metal plate is mounted on said heatsink, and a thin insulating film is positioned between said first metal plate and said second metal plate.

5. The light recycling cavity of claim 1 further comprising a reflective base plate covers said input area of said channel.

6. The light recycling cavity of claim 1 further comprising a fifth light emitting diode at said input area of said channel.

7. The light recycling cavity of claim 1 further comprising a fifth heatsink, and
   a reflective base plate mounted on said fifth heatsink covering said input area of said channel.

8. The light recycling cavity of claim 7 wherein said reflective base plate is a reflective pyramid extending into said channel, said reflective pyramid reflecting light from said at least one light emitting diode to said output area of said channel.

9. The light recycling cavity of claim 8 wherein said reflective pyramid has dichroic faces to increase the reflectivity of the wavelengths of light emitted by the at least one light emitting diodes.

10. The light recycling cavity of claim 1 further comprising a dichroic filter on a red light emitting diode to collimate the emitted red light.

11. The light recycling cavity of claim 1 further comprising a glass taper with dichroic sides extending into said channel, said dichroic faces increasing the reflectivity of the wavelengths of light emitted by the at least one light emitting diodes.

12. The light recycling cavity of claim 1 wherein the length of said channel homogenizes the light emitted through said output area of said channel.

13. The light recycling cavity of claim 1 wherein each of said heatsinks is formed from aluminum, copper, or silver.

14. The light recycling cavity of claim 1 wherein the positioning of said four heatsinks can adjust the aspect ratio of said output area of said channel.

15. The light recycling cavity of claim 1 wherein said at least one light emitting diode mounted on said highly reflective surface of each of said four heatsinks emit white light through said output area of said channel.

16. The light recycling cavity of claim 15 wherein at least one red light emitting diode is mounted on the first heatsink, at least one green light emitting diode is mounted on the second heatsink, at least one blue light emitting diode is mounted on the third heatsink and at least one yellow light emitting diode is mounted on the fourth heatsink.

17. The light recycling cavity of claim 1 wherein the drive currents to said light emitting diodes are adjusted to adjust the color temperature of said light emitted through said output area of said channel.

* * * * *